(12) United States Patent
Chou et al.

(10) Patent No.: US 10,236,240 B2
(45) Date of Patent: Mar. 19, 2019

(54) LOW LOSS SUBSTRATE FOR HIGH DATA RATE APPLICATIONS

(71) Applicant: Advanced Semiconductor Engineering, Inc., Kaohsiung (TW)

(72) Inventors: Yuan-Hsi Chou, Kaohsiung (TW); Tsun-Lung Hsieh, Kaohsiung (TW); Chen-Chao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/152,316

(22) Filed: May 11, 2016

(65) Prior Publication Data

US 2017/0330825 A1 Nov. 16, 2017

(51) Int. Cl.
*H01L 23/00* (2006.01)
*H01L 23/498* (2006.01)

(52) U.S. Cl.
CPC .. *H01L 23/49822* (2013.01); *H01L 23/49838* (2013.01); *H01L 24/17* (2013.01); *H01L 24/49* (2013.01); *H01L 2224/16227* (2013.01); *H01L 2224/48091* (2013.01); *H01L 2224/48106* (2013.01); *H01L 2224/48227* (2013.01); *H01L 2224/49175* (2013.01); *H01L 2924/15311* (2013.01)

(58) Field of Classification Search
CPC ......... H01L 23/49838; H01L 23/49822; H01L 24/17; H01L 2224/16227; H10L 24/49
USPC ......................................................... 174/257
See application file for complete search history.

(56) References Cited

U.S. PATENT DOCUMENTS

| | | | |
|---|---|---|---|
| 6,939,256 B2 | 9/2005 | Giacomoni et al. | |
| 7,612,630 B2 * | 11/2009 | Miller | H01L 23/48 333/109 |
| 2005/0174131 A1 * | 8/2005 | Miller | G01R 1/0491 324/750.3 |
| 2009/0242244 A1 | 10/2009 | Hsu et al. | |
| 2012/0282807 A1 * | 11/2012 | Regnier | H01R 13/6469 439/607.01 |
| 2013/0180763 A1 * | 7/2013 | Moul | H01P 3/088 174/251 |
| 2015/0055307 A1 | 2/2015 | Shaw et al. | |

* cited by examiner

*Primary Examiner* — Tremesha S Willis
(74) *Attorney, Agent, or Firm* — Foley & Lardner LLP; Cliff Z. Liu

(57) ABSTRACT

In one or more embodiments, a substrate includes a patterned conductive layer and a reference layer. The patterned conductive layer includes a pair of first conductive traces, a pair of second conductive traces and a reference trace between the pair of first conductive traces and the pair of second conductive traces. The reference layer is above the patterned conductive layer and defines an opening.

20 Claims, 12 Drawing Sheets

LOW LOSS SUBSTRATE FOR HIGH DATA RATE APPLICATIONS

BACKGROUND

1. Technical Field

The present disclosure relates generally to low loss substrates for high data rate applications. More particularly, the present disclosure relates to substrates having reduced insertion loss.

2. Description of the Related Art

Demand continues to increase for products with reduced dimensions and with improved efficiency and performance. One area of demand for performance improvement is an increase in data rate capability. For example, high data rate technologies are important in an area such as transmission and storage of voluminous quantities of data ("Big Data"). At high data rates, impedance matching and trace insertion loss become more challenging for semiconductor device design and manufacture.

SUMMARY

In one or more embodiments, a substrate includes a patterned conductive layer and a reference layer. The patterned conductive layer includes a pair of first conductive traces, a pair of second conductive traces and a reference trace between the pair of first conductive traces and the pair of second conductive traces. The reference layer is above the patterned conductive layer and defines an opening.

In one or more embodiments, a substrate includes a patterned conductive layer and a reference layer. The patterned conductive layer includes a first conductive trace, a second conductive trace and a reference trace between the first conductive trace and the second conductive trace. The reference layer is above the patterned conductive layer and defines an opening.

In one or more embodiments, a substrate includes an insulative layer, a patterned conductive layer embedded in the insulative layer, and a reference layer disposed on the insulative layer and defining an opening. The patterned conductive layer includes a pair of first conductive traces, a second conductive trace, and a reference trace between the pair of first conductive traces and the second conductive trace.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

One technique for including a semiconductor component in an electronic product includes placing a semiconductor device on a package substrate including electrical circuitry, such as a circuit board, and subsequently packaging the semiconductor device to obtain the semiconductor component. The package substrate may be, for example, a multi-layer rigid substrate. The package substrate may include conductive layers, insulative layers (e.g., dielectric layers), conductive traces and electrical connection pads. One or more semiconductor devices can be attached to the package substrate.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

Figure 1:
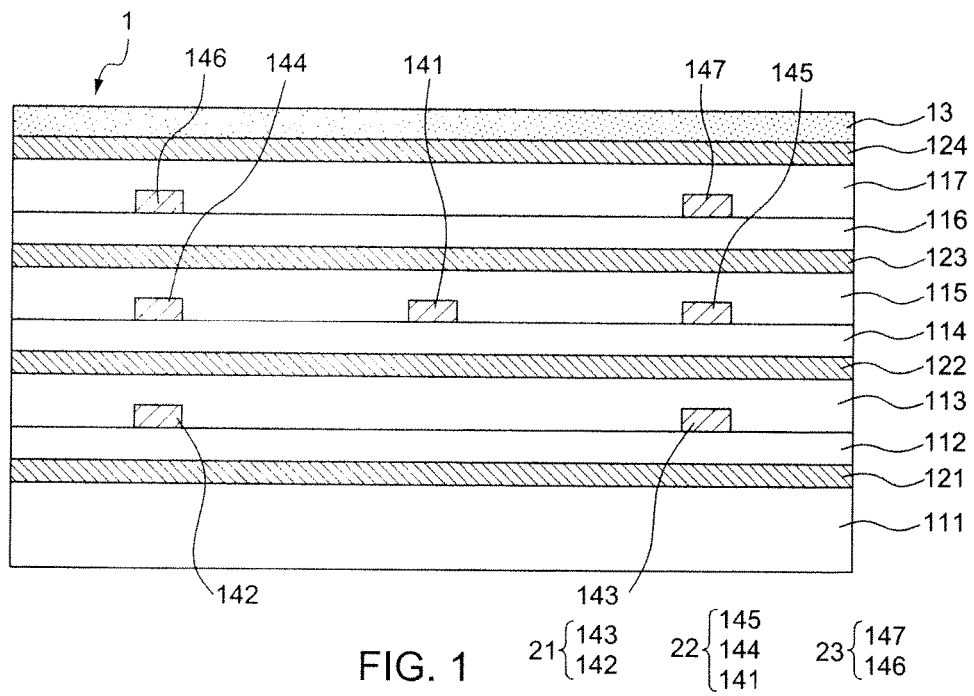
FIG. 1 illustrates a cross-sectional view of a package substrate in accordance with an embodiment of the present disclosure.

FIG. 1 illustrates a cross-sectional view of a package substrate 1 in accordance with an embodiment of the present disclosure. The package substrate 1 includes insulative layers 111, 112, 113, 114, 115, 116 and 117, reference layers 121, 122, 123 and 124, a solder mask layer 13 and patterned conductive layers 21, 22 and 23.

The patterned conductive layer 21 comprises conductive traces 142 and 143. The patterned conductive layer 22 comprises conductive traces 141, 144 and 145. The patterned conductive layer 23 comprises conductive traces 146 and 147.

The reference layer 121 is below the patterned conductive layer 21. The reference layer 122 is above the patterned conductive layer 21 and below the patterned conductive layer 22. The reference layer 123 is above the patterned conductive layer 22 and below the patterned conductive layer 23. The reference layer 124 is above the patterned conductive layer 23.

Each of the reference layers 121, 122, 123 and 124 and the patterned conductive layers 21, 22 and 23 includes a metal or metals, a metal alloy or alloys, a material with metal(s) and/or metal alloy(s) dispersed within, or a combination thereof. For example, the reference layer 121 may include aluminum, copper, titanium or a combination thereof. Each of the reference layers 121, 122, 123 and 124 and the patterned conductive layers 21, 22 and 23 may be formed of multiple layers of the same or different materials, or may be formed of a single layer. One or more of the reference layers 121, 122, 123 and 124 and the patterned conductive layers 21, 22 and 23 may include a single layer while the others may include multiple layers.

The solder mask layer 13 may serve to protect the reference layer 124 and the patterned conductive layer 23. In one or more embodiments, the solder mask layer 13 is, or includes, a photosensitive dry film or other patternable material, such as a polyimide. In other embodiments, the solder mask layer 13 is, or includes, a solder resist. Openings (not shown) may be defined by the solder mask layer 13 to expose a portion of the reference layer 124 for external electrical connection. Such openings may be any suitable shape, including without limitation: columnar (such as cylindrical, elliptic columnar, square columnar, rectangular columnar, or other columnar shape) or non-columnar (such as conical, funnel-shaped, or other non-columnar shape). A side wall of an opening defined by the solder mask layer 13 may be in the shape of an arc. A side wall of an opening defined by the solder mask layer 13 may have a texture.

In one or more embodiments, one or more of the insulative layers 111, 112, 113, 114, 115, 116 and 117 is, or includes, a polymeric material; in one or more embodiments, one or more of the insulative layers 111, 112, 113, 114, 115, 116 and 117 is, or includes, a non-polymeric material. For example, one or more of the insulative layers 111, 112, 113, 114, 115, 116 and 117 may include a flowable dielectric material in a hardened or semi-hardened state, such as, for example, a liquid crystal polymer, prepreg, an Ajinomoto build-up film (ABF), a resin, an epoxy compound, or the like. In one or more embodiments, each of the insulative layers 111, 112, 113, 114, 115, 116 and 117 includes a single resin layer. In other embodiments, one or more of the insulative layers 111, 112, 113, 114, 115, 116 and 117 include multiple resin layers; for example, a first sub-layer formed of a resin and a second sub-layer formed of an enhanced resin (such as a resin enhanced by glass fibers or Kevlar fibers). In one or more embodiments, each of the insulative layers 111, 112, 113, 114, 115, 116 and 117 includes a prepreg, and the prepreg may be in a single layer or multiple layers. In one or more embodiments, each of the insulative layers 111, 112, 113, 114, 115, 116 and 117 includes at least one prepreg layer and at least one resin layer. In one or more embodiments, one or more of the insulative layers 111, 112, 113, 114, 115, 116 and 117 is an ABF with a thickness of approximately 30 to 35 μm.

Insertion losses can affect transmission rate. Insertion loss as used herein refers to a loss of signal power resulting from insertion of a device into a transmission path (e.g., a transmission line or optical fiber) and is expressed in decibels (dB). For example, if the conductive trace 141 is designed for transmitting a high data rate signal (e.g., equal to or greater than approximately 56 gigabits per second (Gb/s)), an impedance of the conductive trace 141 should be carefully controlled to achieve impedance matching. However, because overall package and included substrate dimensions are ever decreasing, thickness of the insulative layers 114 and 115 surrounding the conductive trace 141 may be thin (e.g., 30 to 35 micrometers (μm)), thus a width of the conductive trace 141 is small to attain target conductor impedance values (e.g., 100 Ohms), such as a width less than or equal to approximately 20 μm. However, resistive transmission loss of the narrow width conductive trace 141 for high data rate signals can become significant.

Figure 2:
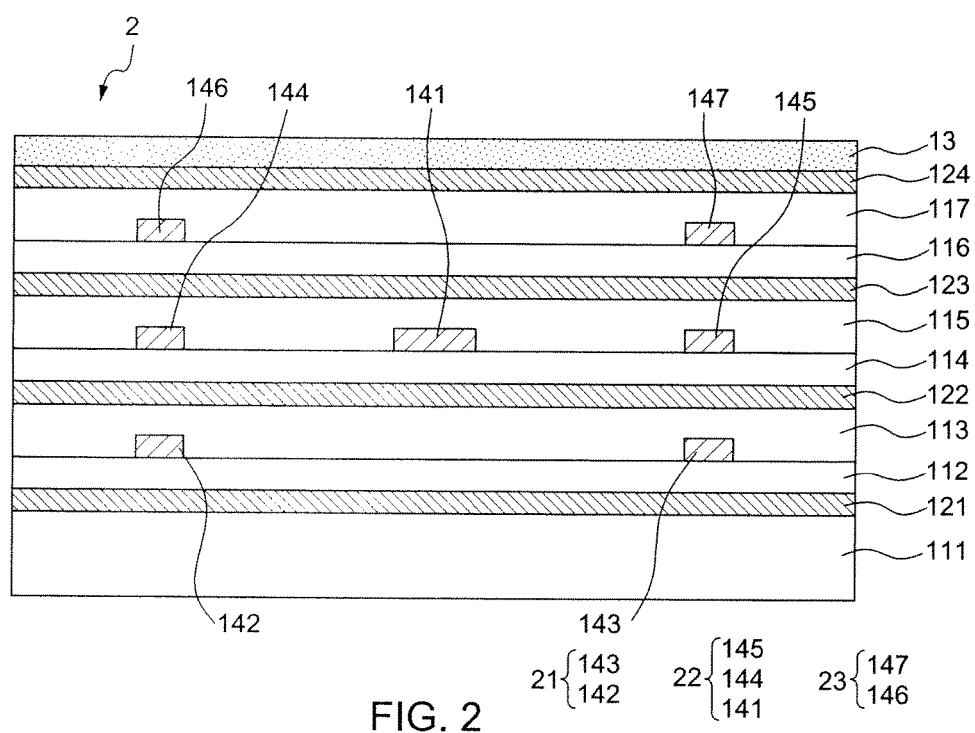
FIG. 2 illustrates a cross-sectional view of a package substrate in accordance with an embodiment of the present disclosure.

To reduce insertion loss, FIG. 2 illustrates a package substrate 2 similar to the package substrate 1 in FIG. 1, except that the conductive trace 141 of FIG. 2 has a greater width (greater than or equal to approximately 40 μm) than the conductive trace 141 of FIG. 1. The conductive trace 141, with greater width, can reduce the resistive transmission loss for high data rate signals. However, greater width of the conductive trace 141 results in a change in the impedance of the conductive trace 141 and the target conductor impedance values may not be attained. Accordingly, insertion loss of the conductive trace 141 may increase for high data rate signals.

Figure 3A:
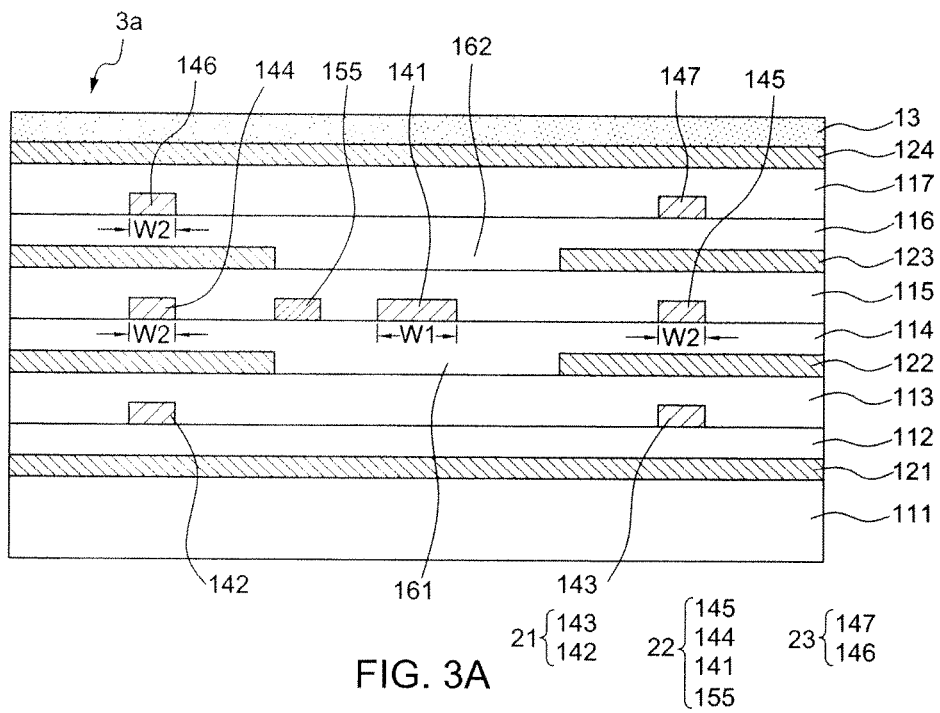
FIG. 3A, FIG. 3B, FIG. 3C, FIG. 3D, FIG. 3E, FIG. 3F, FIG. 3G, FIG. 3H and FIG. 3I illustrate cross-sectional views of package substrates in accordance with embodiments of the present disclosure.

FIG. 3A illustrates a cross-sectional view of a package substrate 3a in accordance with an embodiment of the present disclosure. To attain target conductor impedance values, one or more openings are introduced in the reference layers above or below the conductive trace 141. The package substrate 3a in FIG. 3A is similar to the package substrate 2 in FIG. 2, with differences including that the reference layer 122 defines an opening 161 below the conductive trace 141 and the reference layer 123 defines an opening 162 above the conductive trace 141. By including openings above and/or below the conductive trace 141, an electric field around the conductive trace 141 of FIG. 3A is stronger than an electric field around the conductive trace 141 of FIG. 2, when considering a single-end term and a coupling term with respect to the electric field. A magnetic field around the conductive trace 141 of FIG. 3A is also stronger, and a characteristic impedance will vary significantly with different ground placements. Due to the openings 161, 162 in the reference layers 122, 123, respectively, the characteristic impedance of the conductive trace 141 is much higher as compared to a structure omitting the openings 161, 162. Therefore, to attain target conductor impedance values, a width of the conductive trace 141 of FIG. 3A can be wider than the conductive traces 141 of FIG. 1 or FIG. 2, which results in less insertion loss and thus improves signal integrity. For example, it has been found that a structure such as the package substrate 3a (e.g., with openings 161, 162) can reduce insertion loss at DC (direct current, where frequency is substantially zero) up to about 70% and insertion loss at high frequency can be reduced up to about 25 to about 35%.

Referring still to FIG. 3A, the conductive trace 141 has a width of approximately W1, the conductive traces 144 and 145 of the patterned conductive layer 22 each have a width of approximately W2, and W1 is greater than W2. In one or more embodiments, W1 is greater than or equal to approximately 40 μm. In one or more embodiments, W2 is less than or equal to approximately 20 μm. In one or more embodiments, the conductive trace 146 of the patterned conductive layer 23 has a width of approximately W2. In one or more embodiments, W1 is at least about 1.1×W2, at least about 1.3×W2, or at least about 1.5×W2.

The patterned conductive layer 22 further includes a reference trace 155 between the conductive trace 141 and the conductive trace 144. In one or more embodiments, the reference trace 155 is a ground guard trace for reducing capacitive coupling between the conductive trace 141 and the conductive trace 144.

Figure 3B:
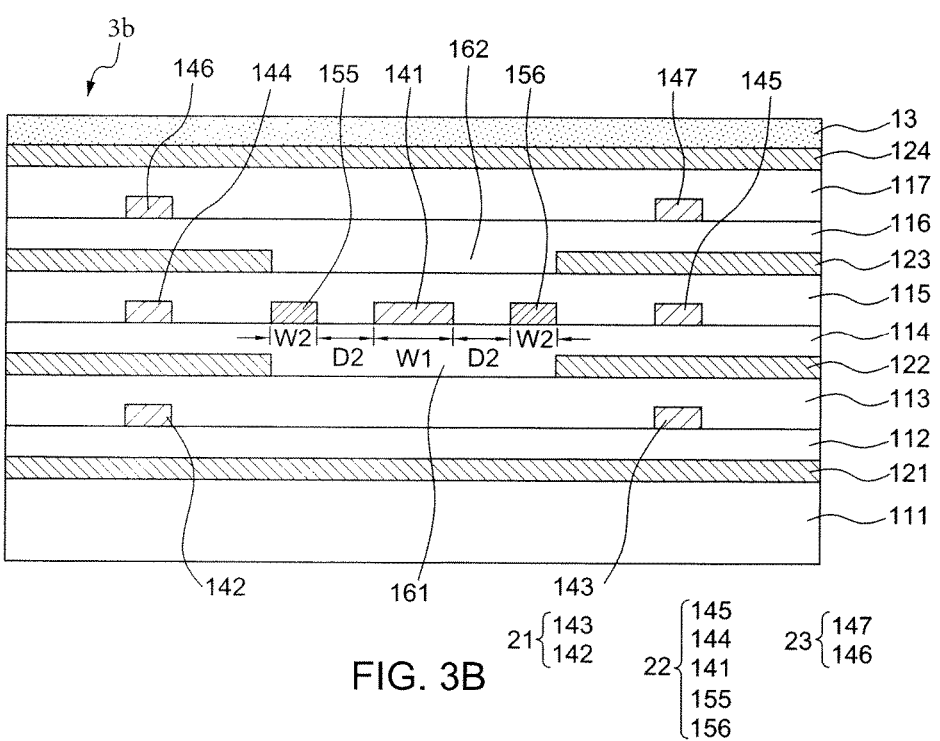

FIG. 3B illustrates a cross-sectional view of a package substrate 3b in accordance with an embodiment of the present disclosure. The package substrate 3b in FIG. 3B is similar to the package substrate 3a in FIG. 3A, with differences including that the patterned conductive layer 22 further includes a reference trace 156 between the conductive trace 141 and the conductive trace 145. The reference traces 155 and 156 each have a width of approximately W2, and the reference traces 155 and 156 are each separated from the conductive trace 141 by a distance of approximately D2. The conductive trace 141 has a width of approximately W1, the opening 162 of the reference layer 123 has a width approximately equal to the quantity (W1+2D2+2W2), and a center of the opening 162 is substantially centered over the conductive trace 141. A width of the opening 161 of the reference layer 122 is approximately equal to the width of the opening 162 of the reference layer 123.

Figure 3C:
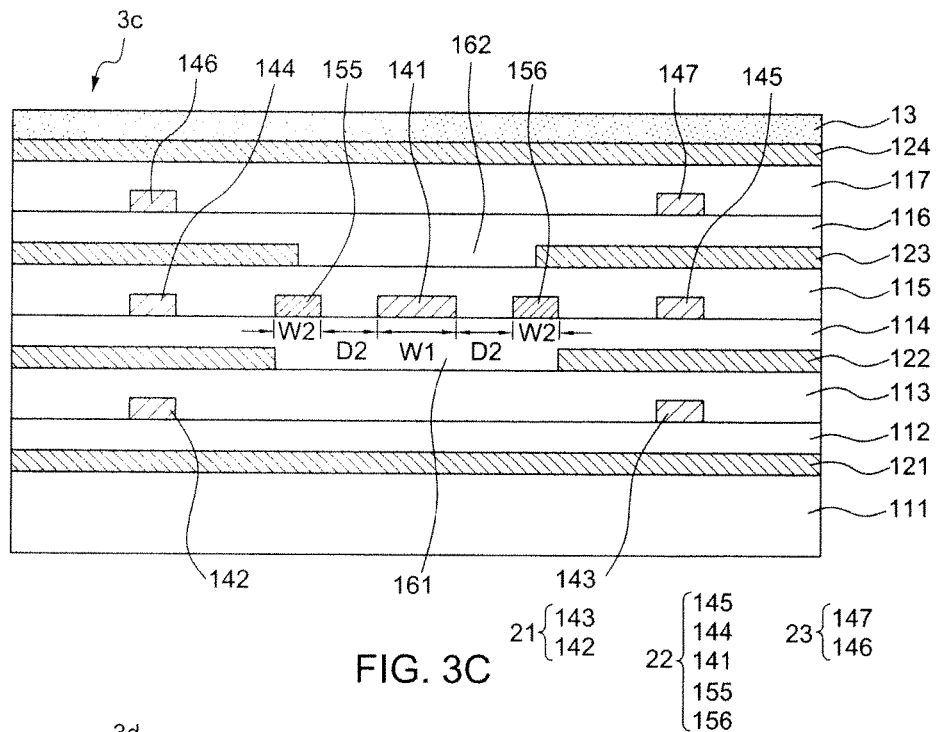

FIG. 3C illustrates a cross-sectional view of a package substrate 3c in accordance with an embodiment of the present disclosure. The package substrate 3c in FIG. 3C is similar to the package substrate 3b in FIG. 3B, with differences including that the width of the opening 162 in FIG. 3C is smaller than in FIG. 3B. As shown in FIG. 3C, the width of the opening 162 is less than the quantity (W1+2D2+2W2) but greater than the quantity (W1+2D2).

Figure 3D:
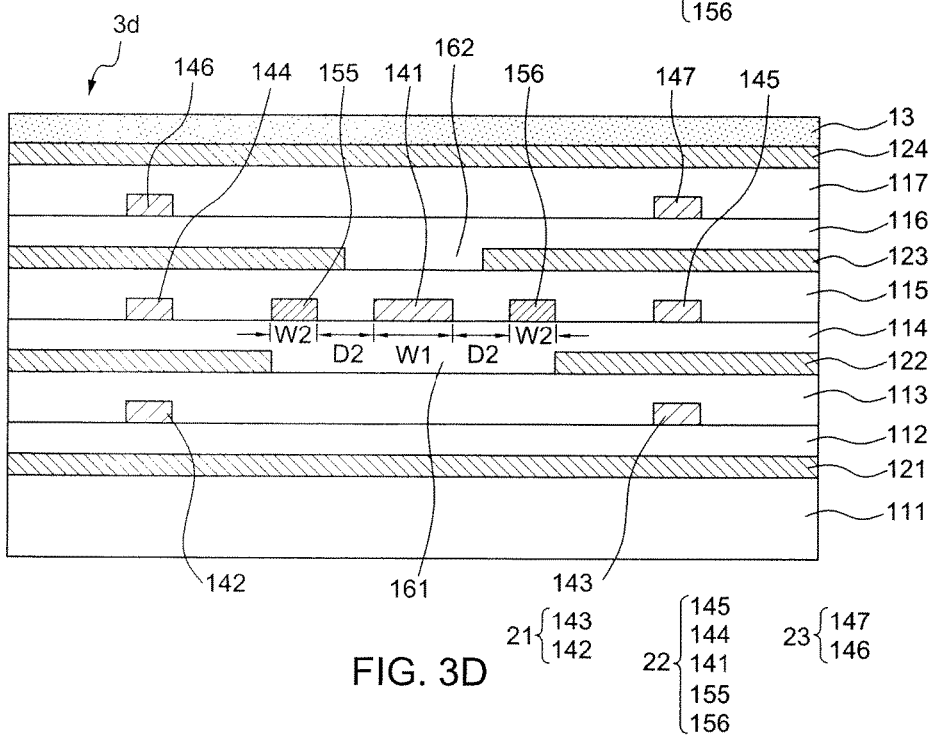

FIG. 3D illustrates a cross-sectional view of a package substrate 3d in accordance with an embodiment of the present disclosure. The package substrate 3d in FIG. 3D is similar to the package substrate 3c in FIG. 3C, with differences including that the width of the opening 162 in FIG. 3D is smaller than in FIG. 3C. As shown in FIG. 3D, the width of the opening 162 is less than the quantity (W1+2D2) but larger than W1.

Figure 3E:
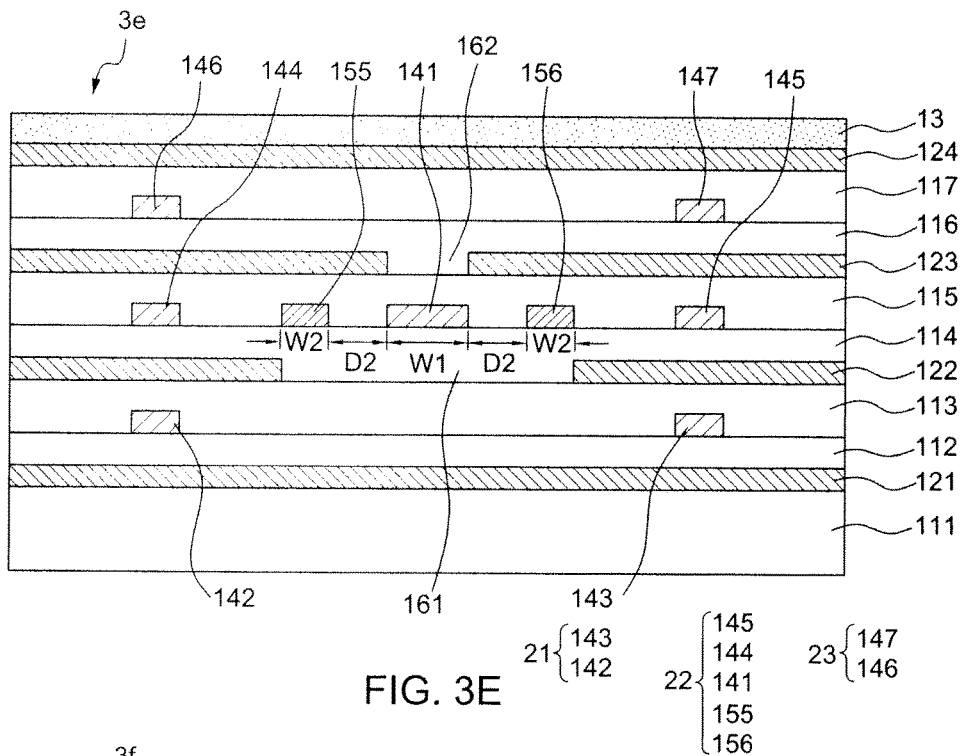

FIG. 3E illustrates a cross-sectional view of a package substrate 3e in accordance with an embodiment of the present disclosure. The package substrate 3e in FIG. 3E is similar to the package substrate 3d in FIG. 3D, with differences including that the width of the opening 162 in FIG. 3E is smaller than in FIG. 3D. As shown in FIG. 3E, the width of the opening 162 is approximately equal to W1.

Figure 3F:
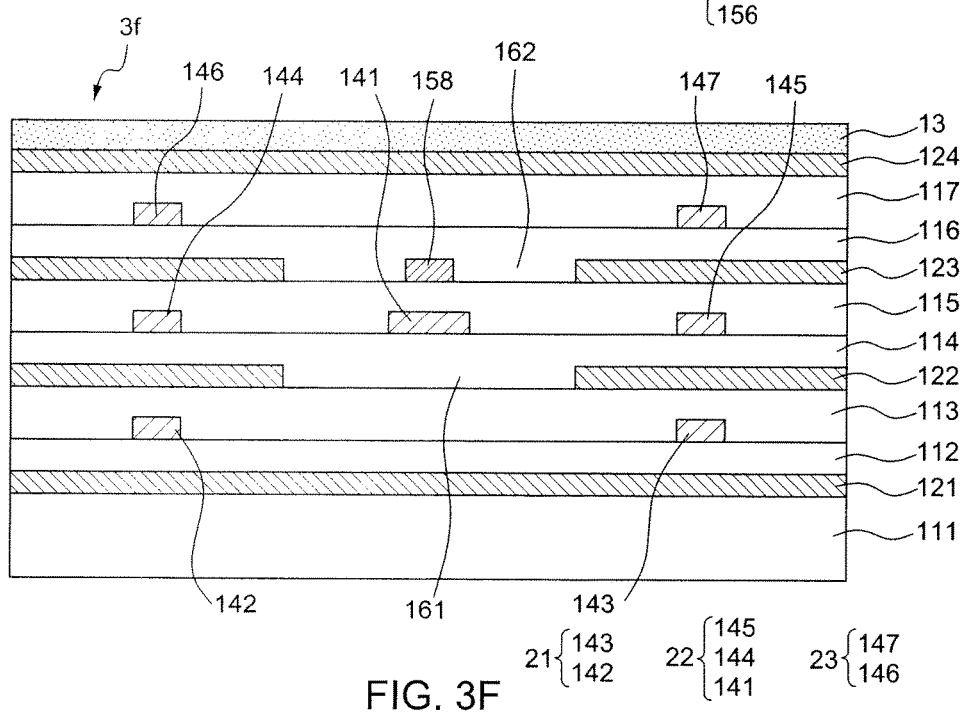

FIG. 3F illustrates a cross-sectional view of a package substrate 3f in accordance with an embodiment of the present disclosure. The package substrate 3f in FIG. 3F is similar to the package substrate 3a in FIG. 3A, with differences including that the package substrate 3f further includes a reference trace 158 in the opening 162 of the reference layer 123. The reference trace 158 is positioned above and substantially centered over the conductive trace 141. The reference trace 158 in the opening 162 may decrease the characteristic impedance of the conductive trace 141 because the electric field and the magnetic field around the conductive trace 141 may be weaker due to the influence of the reference trace 158 in the opening 162. However, the reference trace 158 can also reduce a capacitive coupling between the conductive trace 141 and the conductive traces of the patterned conductive layer 23 (e.g., conductive traces 146 or 147). By reducing the capacitive coupling, the signals transmitted via the conductive trace 141 can suffer less interference from signals on the conductive traces 146 or 147. The reference trace 155 of FIG. 3A may optionally also be included in the embodiment of FIG. 3F (not shown).

Figure 3G:
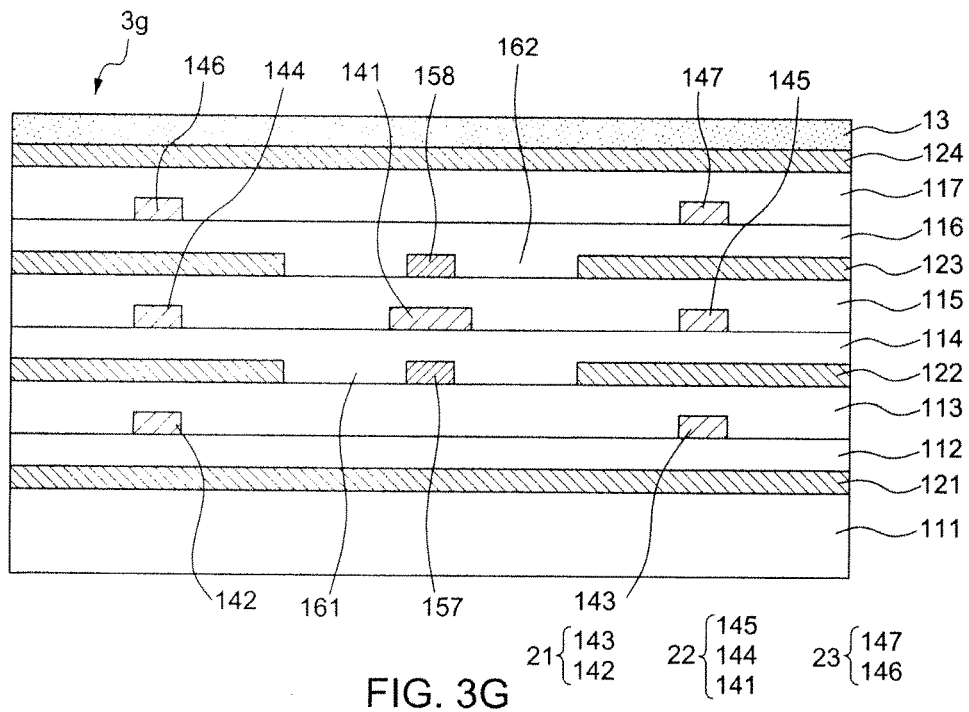

FIG. 3G illustrates a cross-sectional view of a package substrate 3g in accordance with an embodiment of the present disclosure. The package substrate 3g in FIG. 3G is similar to the package substrate 3f in FIG. 3F, with differences including that the package substrate 3g further includes a reference trace 157 in the opening 161 of the reference layer 122. The reference trace 157 is positioned below and substantially centered under the conductive trace 141. The reference trace 157 in the opening 161 may decrease the characteristic impedance of the conductive trace 141 because the electric field and magnetic field around the conductive trace 141 may be weaker due to the influence of the reference trace 157 in the opening 161. However, using the reference trace 157 can reduce a capacitive coupling between the conductive trace 141 and the conductive traces of the patterned conductive layer 21 (e.g., conductive traces 142 or 143). By reducing the capacitive coupling, the signals transmitted via the conductive trace 141 can suffer less interference from signals on the conductive traces 142 or 143.

Figure 3H:
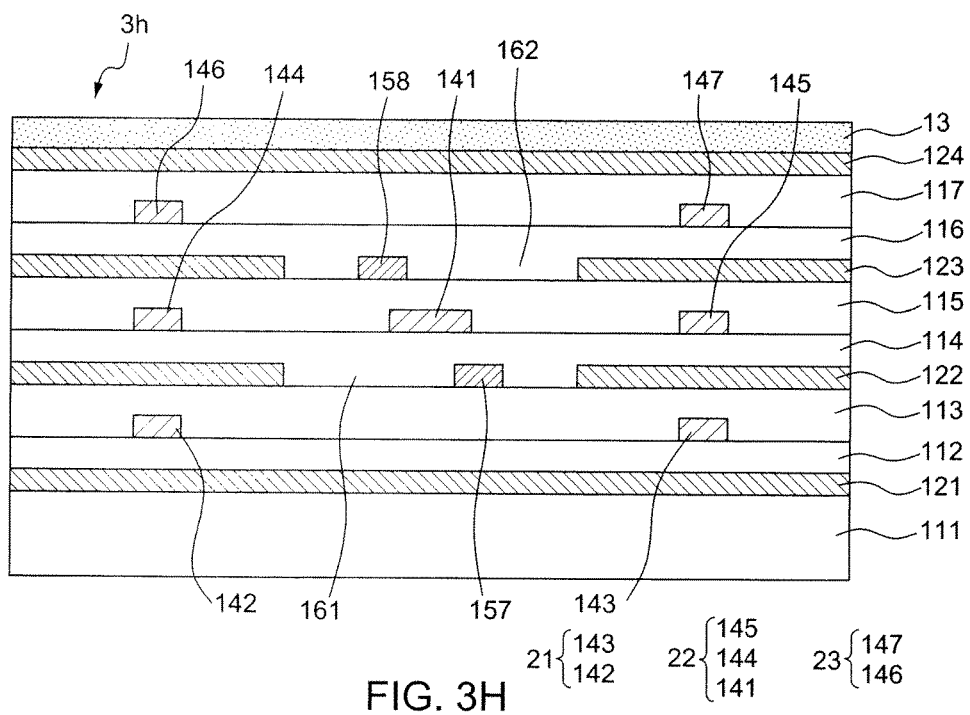

FIG. 3H illustrates a cross-sectional view of a package substrate 3h in accordance with an embodiment of the present disclosure. The package substrate 3h in FIG. 3H is similar to the package substrate 3g in FIG. 3G, with differences including that the reference trace 158 is not centered over the conductive trace 141 and the reference trace 157 is not centered under the conductive trace 141. Rather, both the reference trace 158 and the reference trace 157 are offset from the center of the conductive trace 141.

Figure 3I:
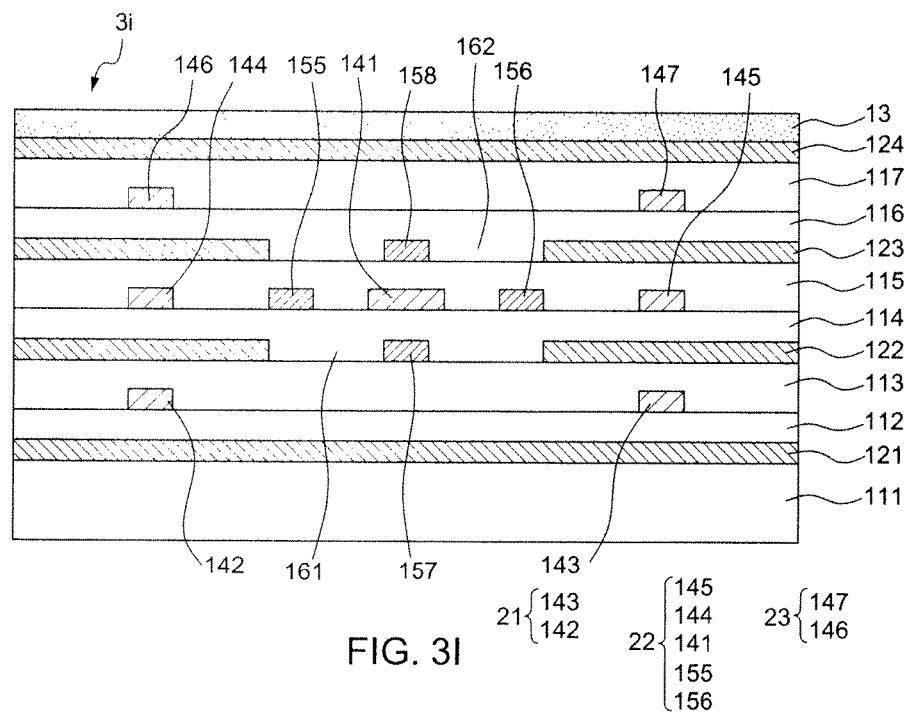

FIG. 3I illustrates a cross-sectional view of a package substrate 3i in accordance with an embodiment of the present disclosure. The package substrate 3i in FIG. 3I is similar to the package substrate 3g in FIG. 3G, with differences including that the package substrate 3i further includes reference traces 155 and 156 in the patterned conductive layer 22, as described with respect to the package substrate 3b in FIG. 3B. In other embodiments, the reference traces 155 and 156 are included, and the reference traces 157 and 158 are offset from the center of the conductive trace 141 as shown in FIG. 3H.

Figure 4:
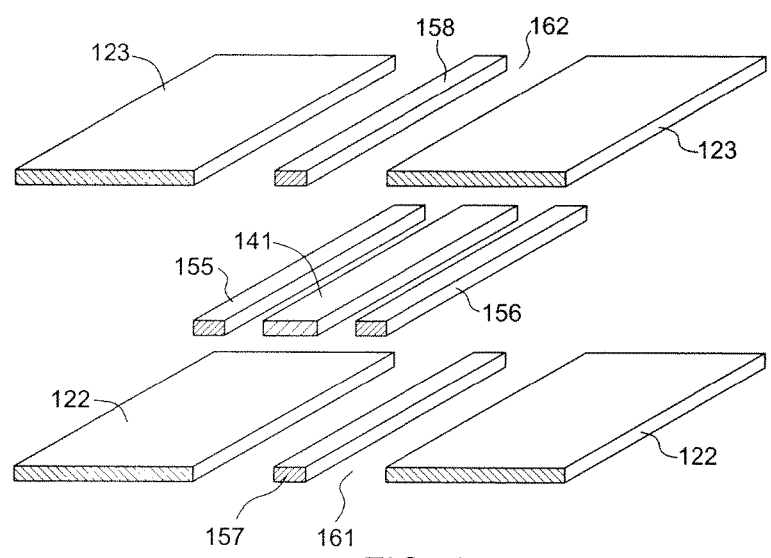
FIG. 4 illustrates an exploded view of a portion of the package substrate shown in FIG. 3I.

FIG. 4 illustrates an exploded view of a portion of the package substrate 3i shown in FIG. 3I. As shown in FIG. 4, the reference traces 155, 156, 157 and 158 surround the conductive trace 141 so as to function as ground guard traces for reducing capacitive coupling between conductive trace 141 and signals on any other conductive traces. The reference trace 158 is in the reference layer 123. The reference trace 157 is in the reference layer 122.

Differential signaling is a method for electrically transmitting information in which a differential pair of electrical signals is transmitted, each of the pair of signals in its own conductor of a pair of conductors. The pair of conductors can be wires or traces on a circuit board. Because the impedances in the differential signaling circuit are equal, external electromagnetic interference tends to affect both conductors in the same manner. However, the receiving circuit detects the difference between the conductors and the interference cancels out, so that the differential signaling technique resists electromagnetic noise compared to a single conductor referenced to ground (for example). Therefore, differential signaling is often used to achieve high data rate. The embodiments illustrated in FIGS. 5A-5I are suitable for differential signaling.

Figure 5A:
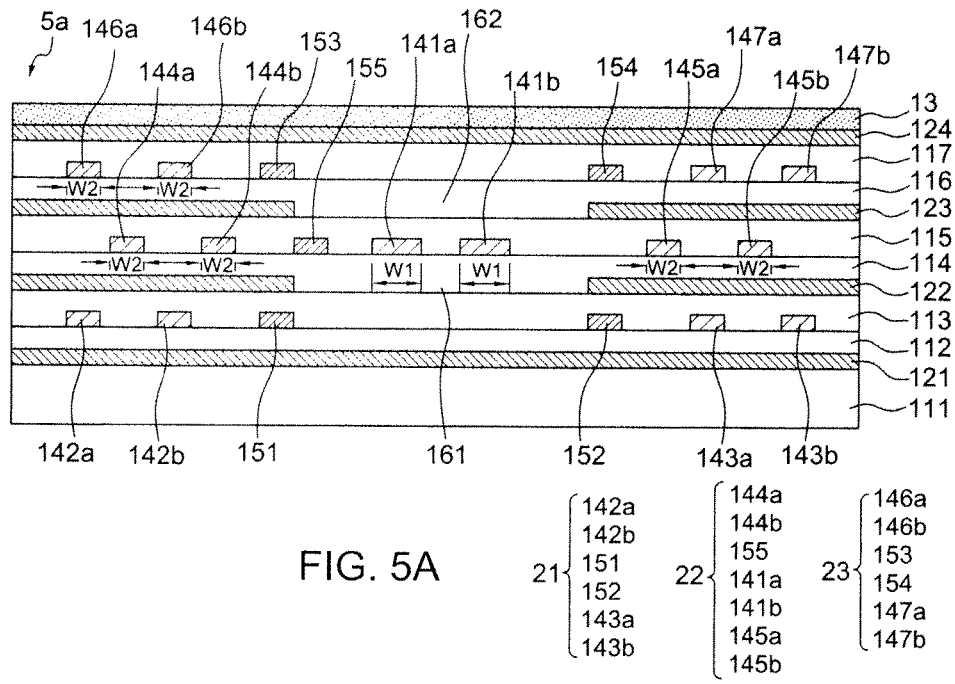
FIG. 5A, FIG. 5B, FIG. 5C, FIG. 5D, FIG. 5E, FIG. 5F, FIG. 5G, FIG. 5H and FIG. 5I illustrate cross-sectional views of package substrates in accordance with embodiments of the present disclosure.

FIG. 5A illustrates a cross-sectional view of a package substrate 5a in accordance with embodiments of the present disclosure. The package substrate 5a includes insulative layers 111, 112, 113, 114, 115, 116 and 117, reference layers 121, 122, 123 and 124, a solder mask layer 13 and patterned conductive layers 21, 22 and 23. The patterned conductive layer 21 includes a pair of conductive traces 142a and 142b and a pair of conductive traces 143a and 143b. The patterned conductive layer 22 includes a pair of conductive traces 141a and 141b, a pair of conductive traces 144a and 144b, and a pair of conductive traces 145a and 145b. The patterned conductive layer 23 includes a pair of conductive traces 146a and 146b and a pair of conductive traces 147a and 147b. The reference layer 121 is below the patterned conductive layer 21. The reference layer 122 is above the patterned conductive layer 21 and below the patterned conductive layer 22. The reference layer 123 is above the patterned conductive layer 22 and below the patterned conductive layer 23. The reference layer 124 is above the patterned conductive layer 23.

To attain a target conductor impedance value, one or more openings in the reference layers above or below the pair of the conductive traces 141a and 141b are introduced. For example, as shown for the package substrate 5a in FIG. 5A similarly to the package substrate 3a in FIG. 3A, the reference layer 123 defines an opening 162 and the reference layer 122 defines an opening 161. The characteristic impedance is higher using the opening 161 and/or the opening 162 as compared to a structure omitting such openings. Therefore, a width of each of the pair of the conductive traces 141a and 141b of FIG. 5A can be wider to compensate for the decrease in characteristic impedance, which results in better insertion loss and an improvement in signal integrity. For example, it has been determined that a loss at DC can be reduced up to about 70% and the insertion loss at high frequency can be reduced up to about 25 to about 35%.

Each of the conductive traces 145a, 145b has a width of approximately W2. In one or more embodiments, each of the conductive traces 146a, 146b has a width of approximately W2. Each of the conductive traces 141a, 141b has a width of approximately W1, and W1 is greater than W2. In one or more embodiments, W1 is greater than or equal to approximately 40 μm. In one or more embodiments, W2 is less than or equal to approximately 20 μm.

Referring still to FIG. 5A, the patterned conductive layer 22 further includes a reference trace 155 between the pair of the conductive traces 141a, 141b and the pair of the conductive traces 144a, 144b. In one or more of the embodiments, the reference trace 155 is a ground guard trace for reducing capacitive coupling between the pair of the conductive traces 141a, 141b and the pair of the conductive traces 144a, 144b.

Figure 5B:
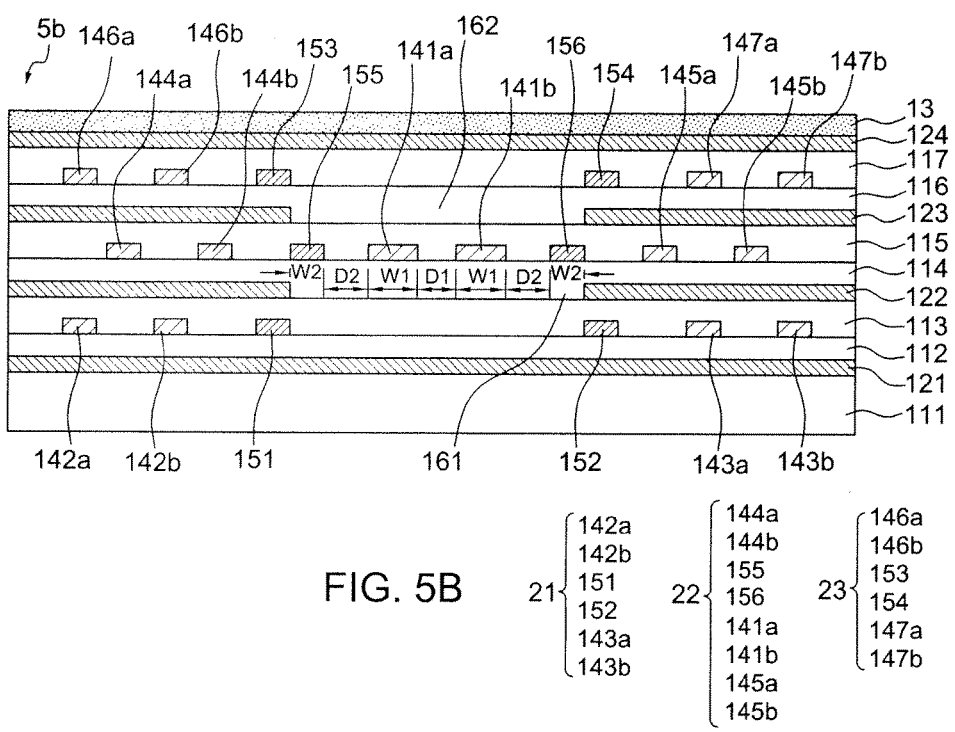

FIG. 5B illustrates a cross-sectional view of a package substrate 5b in accordance with an embodiment of the present disclosure. The package substrate 5b in FIG. 5B is similar to the package substrate 5a in FIG. 5A, with differences including that the patterned conductive layer 22 further includes a reference trace 156 between the pair of the conductive traces 141a, 141b and the pair of the conductive traces 145a and 145b, and a center of the opening 162 is aligned above a center point between the pair of the conductive traces 141a, 141b. Each of the pair of the conductive traces 141a, 141b has a width of approximately W1, the reference trace 155 has a width of approximately W2, each of the pair of the conductive traces 141a, 141b is separated from each other by a distance of approximately D1, the reference trace 155 is separated from the adjacent one of the pair of the conductive traces 141a, 141b by a distance of approximately D2, and the opening 162 of the reference layer 123 has a width approximately equal to the quantity (2W1+D1+2D2+2W2).

Figure 5C:
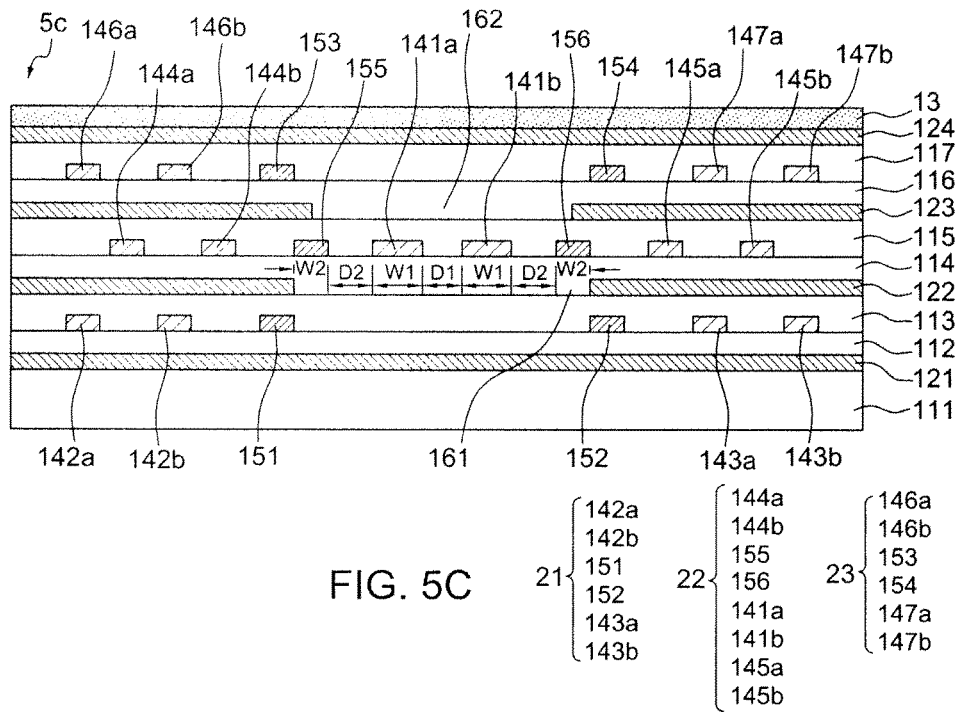

FIG. 5C illustrates a cross-sectional view of a package substrate 5c in accordance with an embodiment of the present disclosure. The package substrate 5c in FIG. 5C is similar to the package substrate 5b in FIG. 5B, with differences including that the width of the opening 162 above the pair of the conductive traces 141a, 141b is smaller than in FIG. 5B, and is less than the quantity (2W1+D1+2D2+2W2) but greater than a quantity (2W1+D1+2D2).

Figure 5D:
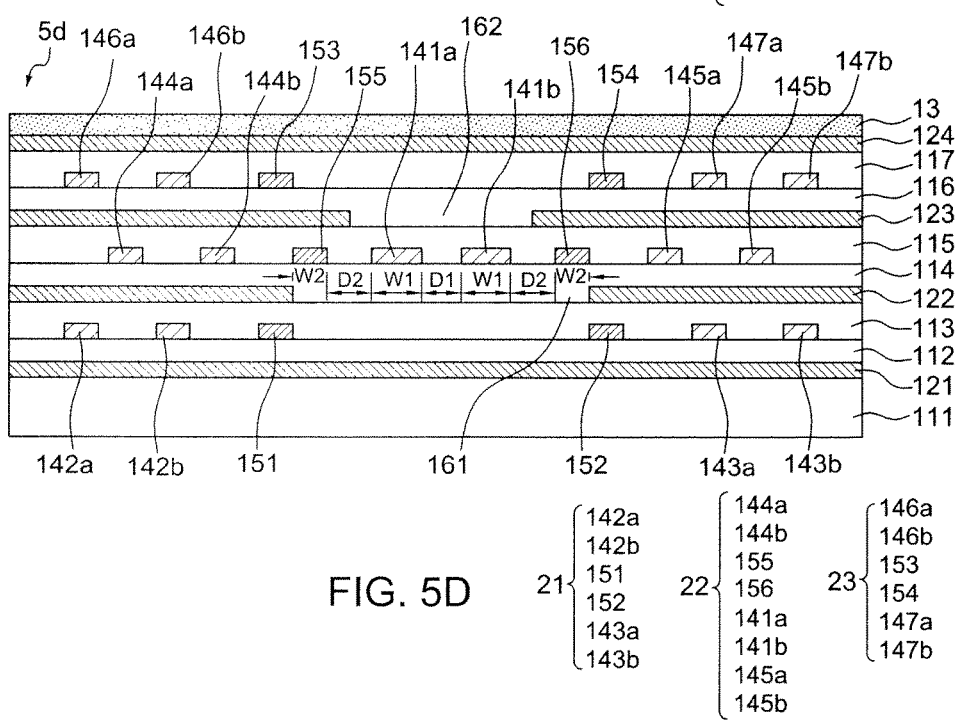

FIG. 5D illustrates a cross-sectional view of a package substrate 5d in accordance with an embodiment of the present disclosure. The package substrate 5d in FIG. 5D is similar to the package substrate 5c in FIG. 5C, with differences including that the width of the opening 162 above the pair of the conductive traces 141a, 141b is smaller than in FIG. 5C, and is less than the quantity (2W1+D1+2D2) but larger than a quantity (2W1+D1).

Figure 5E:
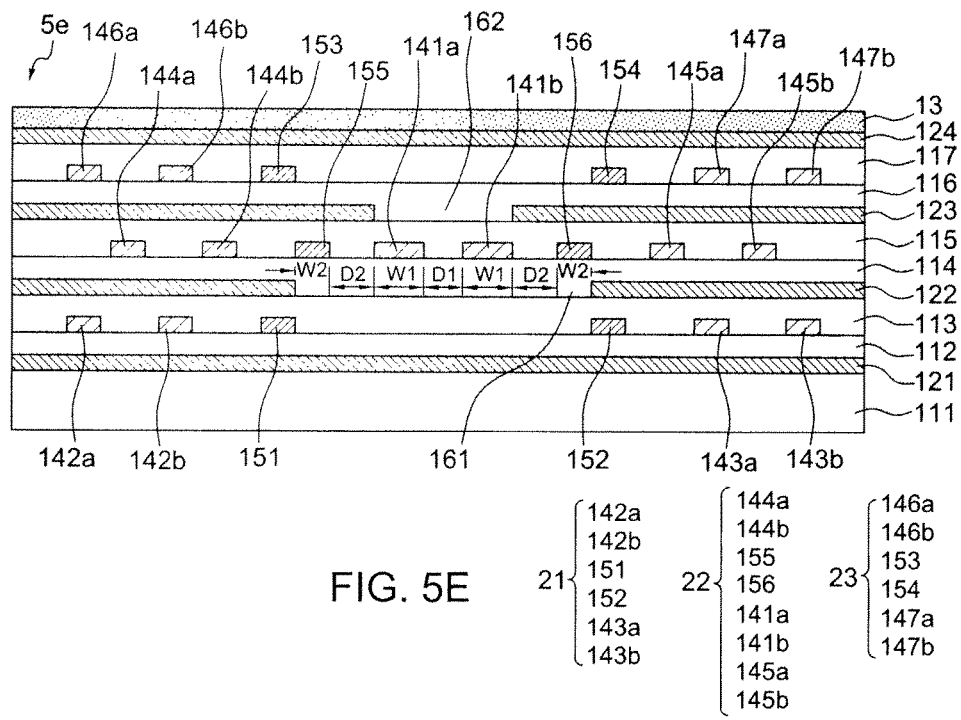

FIG. 5E illustrates a cross-sectional view of a package substrate 5e in accordance with an embodiment of the present disclosure. The package substrate 5e in FIG. 5E is similar to the package substrate 5d in FIG. 5D, with differences including that the width of the opening 162 above the pair of the conductive traces 141a, 141b is smaller than in FIG. 5D, and is approximately equal to the quantity (2W1+D1).

Figure 5F:
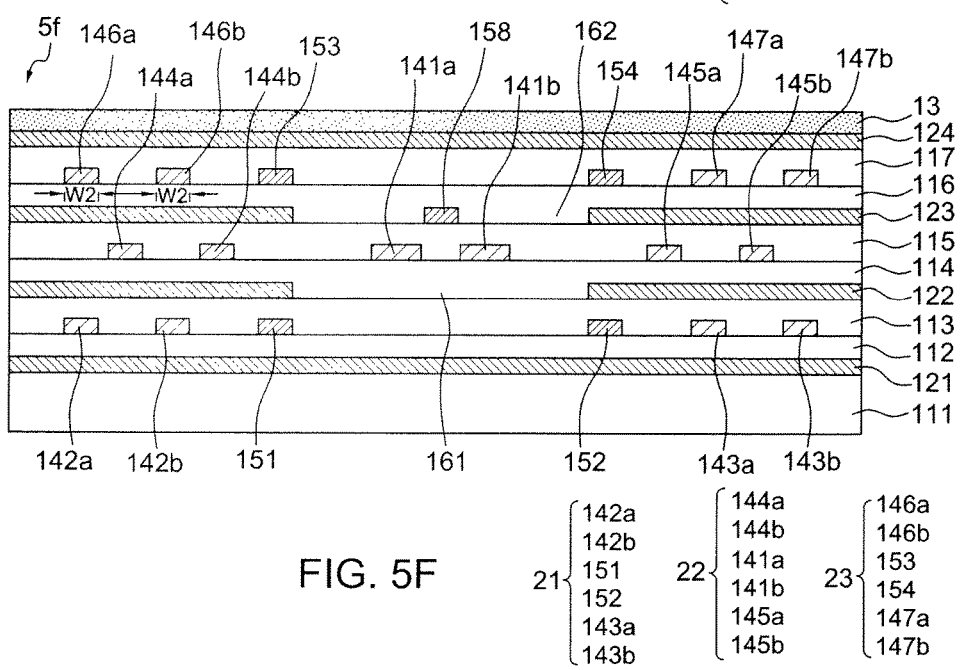

FIG. 5F illustrates a cross-sectional view of a package substrate 5f in accordance with an embodiment of the present disclosure. The package substrate 5f in FIG. 5F is similar to the package substrate 5a in FIG. 5A, with differences including that the package substrate 5f further includes a reference trace 158 in the opening 162 of the reference layer 123. The reference trace 158 is substantially centered above a middle point between the pair of the conductive traces 141a, 141b. The reference trace 155 of FIG. 5A may be included in the embodiment of FIG. 5F (not shown). The reference trace 158 in the opening 162 may decrease the characteristic impedance of the pair of the conductive traces 141a, 141b because the electric field and magnetic field around the pair of the conductive traces 141a, 141b may be weaker due to the influence of the reference trace 158 in the opening 162. However, using the reference trace 158 can reduce capacitive coupling between the pair of the conductive traces 141a, 141b and the conductive traces of the patterned conductive layer 23 (e.g., the pair of the conductive traces 146a, 146b or the pair of the conductive traces 147a, 147b). By reducing the capacitive coupling, the signals transmitted on the pair of the conductive traces 141a, 141b can suffer less interference from signals on the pair of the conductive traces 146a, 146b or the pair of the conductive traces 147a, 147b.

Figure 5G:
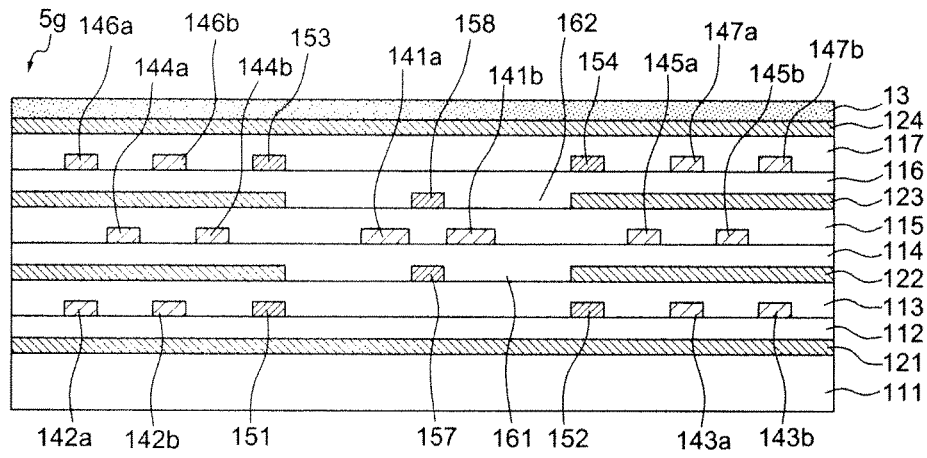

FIG. 5G illustrates a cross-sectional view of a package substrate 5g in accordance with an embodiment of the present disclosure. The package substrate 5g in FIG. 5G is similar to the package substrate 5f in FIG. 5F, with differences including that the package substrate 5g further includes a reference trace 157 in the opening 161 of the reference layer 122. The reference trace 157 is substantially centered below a center point between the pair of the conductive traces 141a, 141b. The reference trace 157 in the opening 161 may decrease the characteristic impedance of the pair of the conductive traces 141a, 141b because the electric field and magnetic field around the pair of the conductive traces 141a, 141b may be weaker due to the influence of the reference trace 157 in the opening 161. However, the reference trace 157 can reduce the capacitive coupling between the pair of the conductive traces 141a, 141b and the conductive traces of patterned conductive layer 21 (e.g., the pair of the conductive traces 142a, 142b or the pair of the conductive traces 143a, 143b). By reducing the capacitive coupling, the signals transmitted on the pair of the conductive traces 141a, 141b can suffer less interference from signals on the pair of the conductive traces 142a, 142b or the pair of the conductive traces 143a, 143b.

Figure 5H:
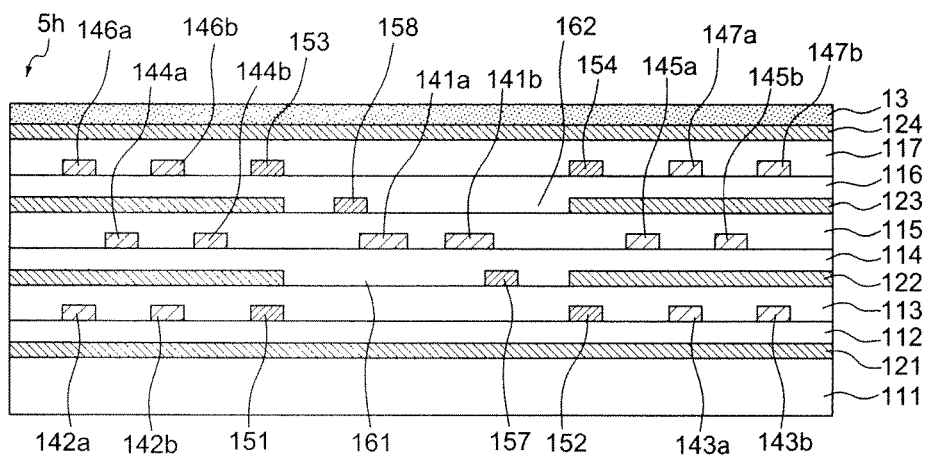

FIG. 5H illustrates a cross-sectional view of a package substrate 5h in accordance with an embodiment of the present disclosure. The package substrate 5h in FIG. 5H is similar to the package substrate 5g in FIG. 5G, with differences including that the reference trace 158 is not centered above the middle point of the pair of the conductive traces 141a, 141b and the reference trace 157 is not centered below the middle point of the pair of the conductive traces 141a, 141b.

Figure 5I:
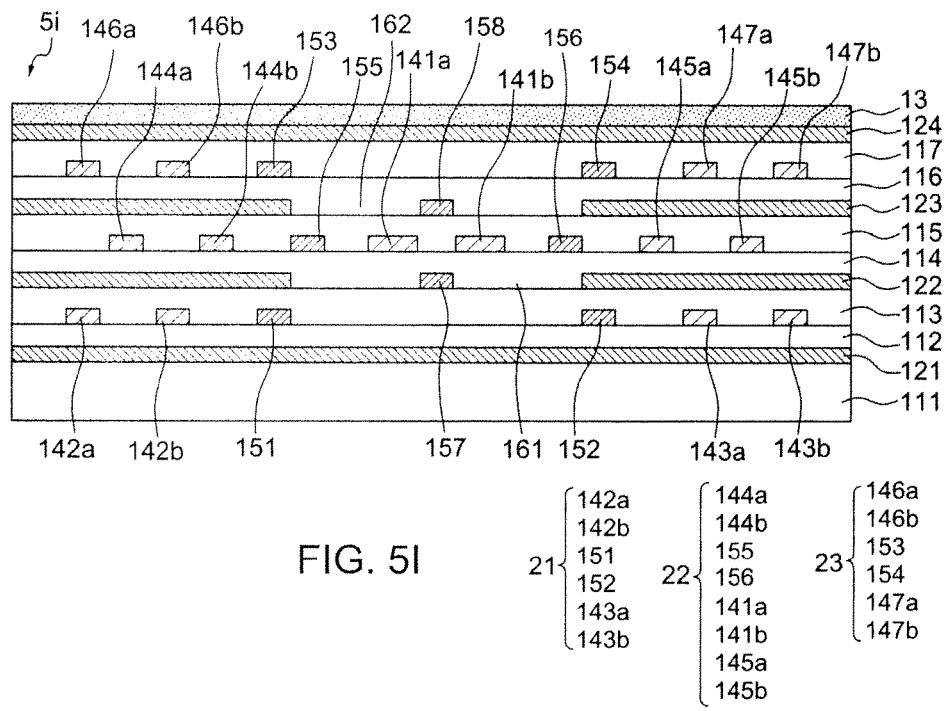

FIG. 5I illustrates a cross-sectional view of a package substrate 5i in accordance with an embodiment of the present disclosure. The package substrate 5i in FIG. 5I is similar to the package substrate 5b in FIG. 5B, with differences including that the package substrate 5f further includes a reference trace 158 in the opening 162 of the reference layer 123 and a reference trace 157 in the opening 161 of the reference layer 122. The reference trace 158 is substantially centered above the middle point of the pair of the conductive traces 141a, 141b and the reference trace 157 is substantially centered below the middle point of the pair of the conductive traces 141a, 141b. In one or more embodiments, one or both of the reference trace 157 and the reference trace 158 may be offset so as not to be centered with respect to the middle point of the pair of the conductive traces 141a, 141b.

Figure 6:
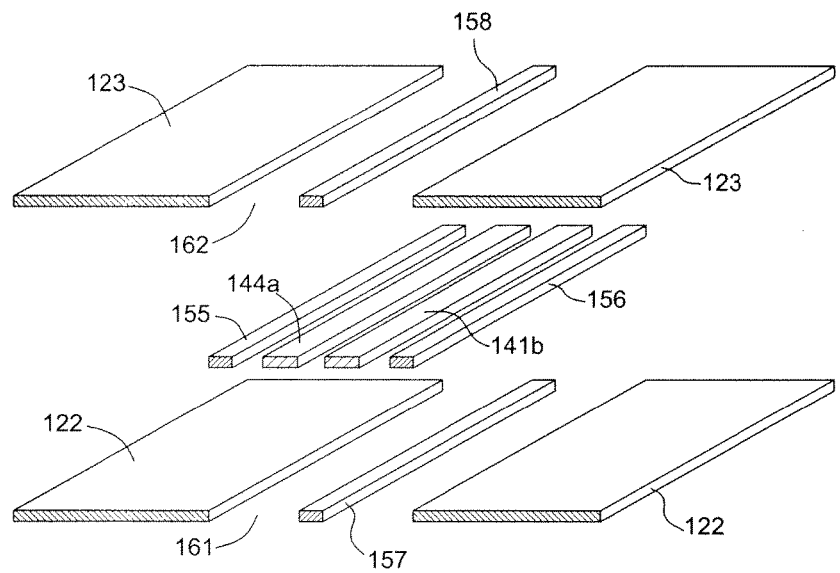
FIG. 6 illustrates an exploded view of a portion of the package substrate shown in FIG. 5I.

FIG. 6 illustrates an exploded view of a portion of the package substrate 5i shown in FIG. 5I. As shown in FIG. 6, the reference traces 155, 156, 157 and 158 surround the pair of the conductive traces 141a, 141b to function as ground guard traces for reducing capacitive coupling between the pair of the conductive traces 141a, 141b and signals on any other conductive traces. The reference trace 158 is in the reference layer 123. The reference trace 157 is in the reference layer 122.

Figure 7:
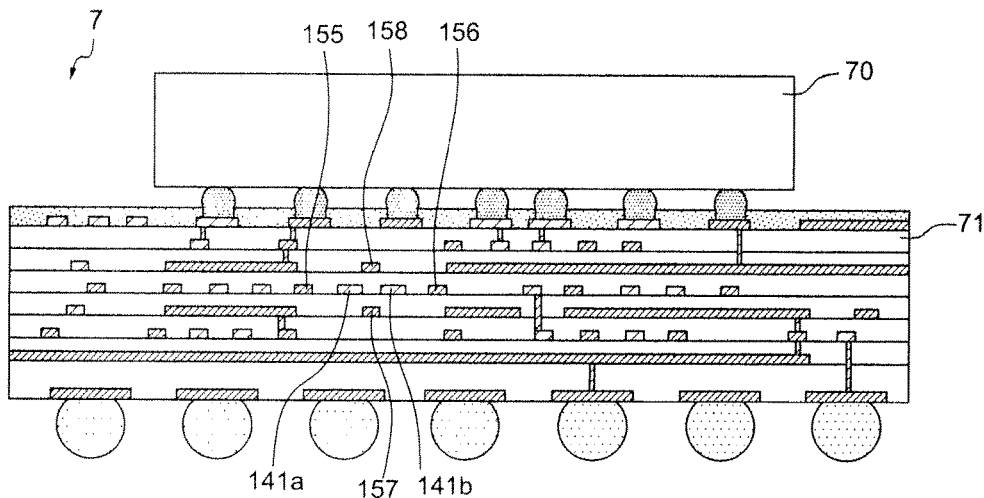
FIG. 7 illustrates a cross-sectional view of a flip-chip semiconductor package structure including a package substrate in accordance with an embodiment of the present disclosure.

FIG. 7 illustrates a cross-sectional view of a flip-chip semiconductor package structure 7 including a package substrate in accordance with an embodiment of the present disclosure. The package structure 7 includes at least one semiconductor device 70 and a package substrate 71 according to the present disclosure. The package substrate 71 is disposed between the semiconductor device(s) 70 and a base substrate (not shown) and electrically connects the semiconductor devices 70 and/or electrically connects the semiconductor device(s) 70 with the base substrate. The semiconductor device(s) 70 are interconnected to the package substrate 71 with solder bumps that have been deposited onto the pads of the semiconductor device(s) 70. To mount a semiconductor device 70 to the package substrate 71, the semiconductor device 70 is inverted (flipped over) so that an upper-facing side faces down, and aligned so that pads of the semiconductor device 70 align with corresponding pads on the package substrate 71, and the solder is reflowed to complete the interconnect. In one or more embodiments, the semiconductor package structure 7 may be encapsulated. Similar to FIG. 5I, reference traces 155, 156, 157 and 158 of the semiconductor package structure 7 surround a pair of conductive traces 141a, 141b to function as ground guard traces for reducing capacitive coupling between the pair of the conductive traces 141a, 141b and signals on any other conductive traces.

Figure 8:
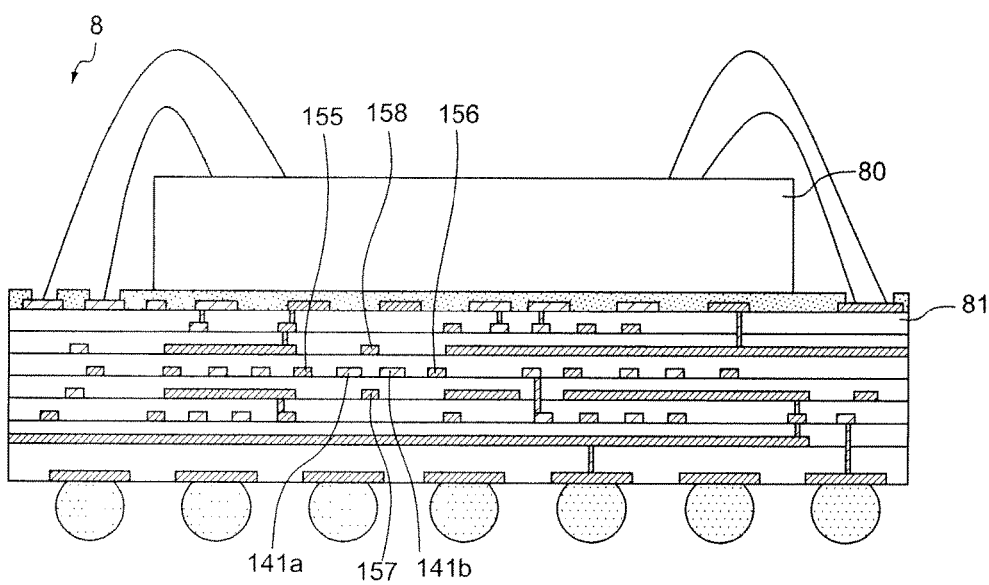
FIG. 8 illustrates a cross-sectional view of a bond wire semiconductor package structure including a package substrate in accordance with an embodiment of the present disclosure.

FIG. 8 illustrates a cross-sectional view of a bond wire semiconductor package structure 8 including a package substrate in accordance with an embodiment of the present disclosure. The semiconductor package structure 8 in FIG. 8 is similar to the semiconductor package structure 7 in FIG. 7, with differences including that at least one semiconductor device 80 is mounted upright on a package substrate 81 and wires are used to interconnect the semiconductor device(s) 80 to the package substrate 81. In one or more embodiments, the semiconductor package structure 8 may be encapsulated. Similar to FIG. 5I, reference traces 155, 156, 157 and 158 surround a pair of conductive traces 141a, 141b to function as ground guard traces for reducing capacitive coupling between the pair of the conductive traces 141a, 141b and signals on any other conductive traces.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:
1. A substrate, comprising:
a first patterned conductive layer, the first patterned conductive layer being a single layer and comprising:
a pair of first transmission lines adjacent to each other;
a pair of second transmission lines adjacent to each other; and a first reference trace between the pair of first transmission lines and the pair of second transmission lines; and
a first reference layer above the first patterned conductive layer, the first reference layer defining an opening.

2. The substrate of claim 1, the first patterned conductive layer further comprising a third conductive trace, wherein each of the pair of first transmission lines has a first width, the third conductive trace has a second width, and the first width is greater than the second width.

3. The substrate of claim 2, wherein the second width of the third conductive trace is less than or equal to approximately 20 micrometers (μm).

4. The substrate of claim 1, wherein each of the pair of first transmission lines has a first width greater than or equal to approximately 40 μm.

5. The substrate of claim 1, wherein each of the pair of first transmission lines has a first width, the first transmission lines are separated from each other by a first distance, and the opening of the first reference layer has a third width greater than or equal to a quantity.

6. The substrate of claim 1, wherein each of the pair of first transmission lines has a first width, the first reference trace has a second width, the first transmission lines are separated from each other by a first distance, the first reference trace is separated from an adjacent one of the pair of first transmission lines by a second distance, and the opening of the first reference layer has a third width that is less than or equal to a quantity.

7. The substrate of claim 1, further comprising a second reference trace in the opening and above the first patterned conductive layer.

8. The substrate of claim 1, further comprising a second patterned conductive layer above the first patterned conductive layer, the second patterned conductive layer comprising a third conductive trace, wherein each of the first transmission lines has a first width, the third conductive trace has a second width, and the first width is greater than the second width.

9. A substrate, comprising:
a first patterned conductive layer, the first patterned conductive layer being a single layer and comprising:
a first conductive trace;
a second conductive trace; and
a first reference trace between the first conductive trace and the second conductive trace;
a first reference layer above the first patterned conductive layer, the first reference layer defining an opening; and
a second reference trace in the opening and above the first patterned conductive layer.

10. The substrate of claim 9, wherein the first conductive trace has a first width, the second conductive trace has a second width, and the first width is greater than second width.

11. The substrate of claim 10, wherein the second width of the second conductive trace is less than or equal to approximately 20 micrometers (μm).

12. The substrate of claim 9, wherein the first conductive trace has a first width greater than or equal to approximately 40 μm.

13. The substrate of claim 9, further comprising a second patterned conductive layer above the first reference layer, the second patterned conductive layer comprising a third conductive trace, wherein the first conductive trace has a first width, the third conductive trace has a second width, and the first width is greater than second width.

14. The substrate of claim 13, wherein the second width of the third conductive trace is less than or equal to approximately 20 μm.

15. A substrate, comprising:
a first insulative layer;
a first patterned conductive layer embedded in the first insulative layer, the first patterned conductive layer being a single layer and comprising:
a pair of first transmission lines adjacent to each other;
a second conductive trace; and
a first reference trace between the pair of first conductive trace transmission lines and the second conductive trace; and
a first reference layer disposed on the first insulative layer and defining an opening.

16. The substrate of claim 15, wherein each of the pair of first transmission lines has a first width, the second conductive trace has a second width, and the first width is greater than the second width.

17. The substrate of claim 16, wherein the second width of the second conductive trace is less than or equal to approximately 20 μm.

18. The substrate of claim 15, wherein each of the pair of first transmission lines has a first width greater than or equal to approximately 40 μm.

19. The substrate of claim 15, further comprising a second patterned conductive layer above the first reference layer, the second patterned conductive layer comprising a third conductive trace, wherein each of the pair of first transmission lines has a first width, the third conductive trace has a second width, and the first width is greater than second width.

20. The substrate of claim 15, further comprising a second reference trace in the opening and above the first patterned conductive layer.

* * * * *